United States Patent [19]
Kim et al.

[11] Patent Number: 5,821,164
[45] Date of Patent: Oct. 13, 1998

[54] METHOD FOR FORMING METAL LINE

[75] Inventors: Yong Kwon Kim; Chang Reol Kim, both of Chungcheongbuk-do, Rep. of Korea

[73] Assignee: LG Semicon Co., Ltd., Chungcheongbuk-Do, Rep. of Korea

[21] Appl. No.: 712,603

[22] Filed: Sep. 13, 1996

[30] Foreign Application Priority Data

Apr. 12, 1996 [KR] Rep. of Korea .................. 11062/1996

[51] Int. Cl.⁶ ......................... H01L 21/44; H01L 21/463
[52] U.S. Cl. ......................... 438/633; 438/626; 438/637; 438/700; 438/692
[58] Field of Search ................................... 438/626, 637, 438/623, 672, 633, 700, 692

[56] References Cited

U.S. PATENT DOCUMENTS 5,158,910 10/1992 Cooker .
5,302,551 4/1994 Iranmanesh et al. .................. 437/195
5,518,963 5/1996 Park .
5,616,519 4/1997 Ping .

*Primary Examiner*—Caridad Everhart
*Attorney, Agent, or Firm*—Morgan, Lewis & Bockius LLP

[57] ABSTRACT

A method of forming a metal line structure for use with a semiconductor device includes the steps of: preparing a semiconductor substrate; forming a first line on the semiconductor substrate; forming a plug pattern on the first line; forming at least one insulating layer on an exposed surface of the first line and on the plug pattern; planarizing the insulating layer and, simultaneously, removing the plug pattern to form a contact hole which exposes at least a portion of the first line; and forming a second line in the contact hole such that the second line is configured to couple with the first line.

36 Claims, 9 Drawing Sheets

METHOD FOR FORMING METAL LINE

BACKGROUND OF THE INVENTION

1. Field of the Invention

The present invention relates to a metal line of a semiconductor device and, more particularly, to a method for forming a metal line which is suitable to facilitate metal line formation and to enhance productivity.

2. Discussion of the Related Art

Generally, in a conventional method for forming a metal line of a semiconductor, a plurality of layers are deposited on a substrate to manufacture a desired device at a specific portion in accordance with the goal of higher integration of the semiconductor device.

However, the steplike difference, namely, the depth of the substrate's surface, is increased due to the formation of a multi-level insulating layer and lines. This causes problems such as difficulty in ensuring focal depth in a photo-etching step, shorts between lines, stress migration, and electro migration.

Therefore, a method of planarizing the interlevel insulating layer by a chemical mechanical polishing (CMP) process has been proposed. This CMP enables global planarization.

In this respect, U.S. Pat. No. 5,302,551 discloses that the double-layered insulating layer is formed on a first line, and then planarized by the CMP step. Another insulating layer is deposited again on the insulating layer, and then a contact hole for coupling a second line is formed by selectively removing the insulating layer using a dry-etching method.

The conventional technique for forming the metal line will be described below, with reference to the attached drawings.

FIGS. 1a to 1g illustrate the manufacturing procedure of a conventional metal line.

As illustrated in FIG. 1a, the conventional method for forming a metal line is carried out in a manner such that a semiconductor substrate 1 is prepared, and then a conductive layer 2 is formed by depositing a metal on the semiconductor substrate 1.

As illustrated in FIG. 1b, portions of the conductive layer 2 are selectively removed by photolithography and etching steps to form a first line 2a.

As illustrated in FIG. 1c, an oxide layer is deposited on an exposed surface of the first line 2a and semiconductor substrate 1 to form an interlevel insulating layer 3.

As illustrated in FIG. 1d, an oxide layer is thickly deposited on the first interlevel insulating layer 3, to form a second interlevel insulating layer 4.

As illustrated in FIG. 1e, portions of the second interlevel insulating layer 4 are selectively removed by a predetermined thickness by the CMP or etch-back step to be planarized, to thereby expose the top surface of the first interlevel insulating layer. Then, a third interlevel insulating layer 5 is formed on the exposed surface of the second planarized interlevel insulating layer 4a and first interlevel insulating layer 3.

As illustrated in FIG. 1f, specific portions of the first and third interlevel insulating layers 3 and 5 are selectively removed to expose the first line 2a, using the photolithography and dry etching process, to thereby form a second line-connection contact hole 6 and sections 3a and 5a.

As illustrated in FIG. 1g, a metal is deposited on the exposed surface of the third interlevel insulating layer 5a including the contact hole 6, and then the metal is selectively removed by a photolithography and etching step or etchback step, to form a second line 7. This finishes the formation steps of the metal line.

As described above, the conventional metal line formation method has problems as follows.

First, the etching thickness of a plug pattern, namely, the depth of the second line, is great due to the dry etching step used when the contact hole for the upper and lower part lines is formed.

Second, an additional polish stop layer must be formed when the interlevel insulating layer is formed. Therefore, the whole process becomes difficult and complicated.

SUMMARY OF THE INVENTION

Accordingly, the present invention is directed to a method for forming metal line that substantially obviates one or more of the problems due to limitations and disadvantages of the related art.

An object of the invention is to solve the problems of the prior art, and to provide a method for forming a metal line structure which facilitates the metal line formation and enhances its productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming metal line structure for use with a semiconductor device includes the steps of: preparing a semiconductor substrate; forming a first line on the semiconductor substrate; forming a plug pattern on the first line; forming a first insulating layer on an exposed surface of the first line and on the plug pattern; forming a second insulating layer on the first insulating layer; planarizing at least the second insulating layer and, simultaneously, removing the plug pattern to form a contact hole exposing the first line; and forming a second line in the contact hole such that the second line is configured to couple with the first line.

In another aspect, the present invention provides a method of forming a metal line structure for use with a semiconductor device, the method including the steps of: preparing a semiconductor substrate; forming a first line on the semiconductor substrate; forming a plug pattern on the first line; forming an insulating layer on an exposed surface of the first line and on the plug pattern; polishing the insulating layer to achieve planarization and, simultaneously, removing the plug pattern to form a contact hole exposing at least a portion of the first line; and forming a second line in the contact hole such that the second line is configured to be connected to the first line.

In a further aspect, a method of forming a metal line in accordance with the invention includes the steps of: preparing a semiconductor substrate; forming a first line on the semiconductor substrate; forming a plug pattern on the first line; forming at least one insulating layer on an exposed surface of the first line and on the plug pattern; planarizing the insulating layer and, simultaneously, removing the plug pattern to form a contact hole exposing at least a portion of the first line; and forming a second line in the contact hole such that the second line is configured to couple with the first line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
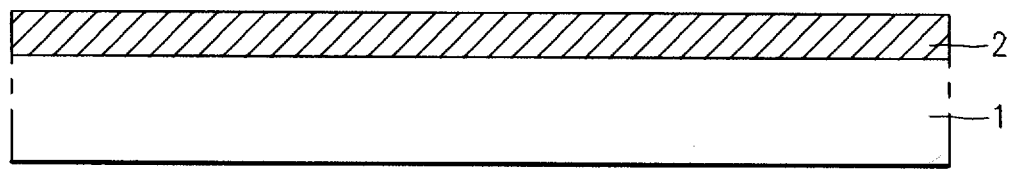
FIGS. 1a to 1g illustrate a manufacturing procedure for a conventional metal line.
Figure 1B:
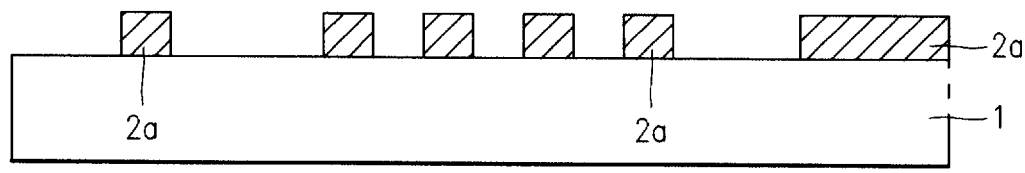
Figure 1C:
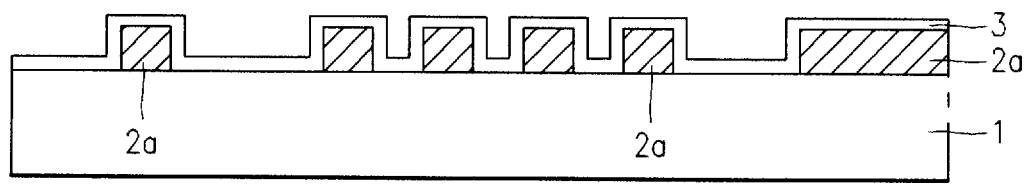
Figure 1D:
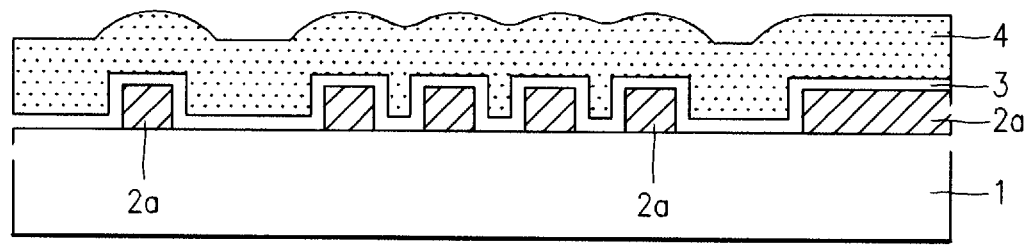
Figure 1E:
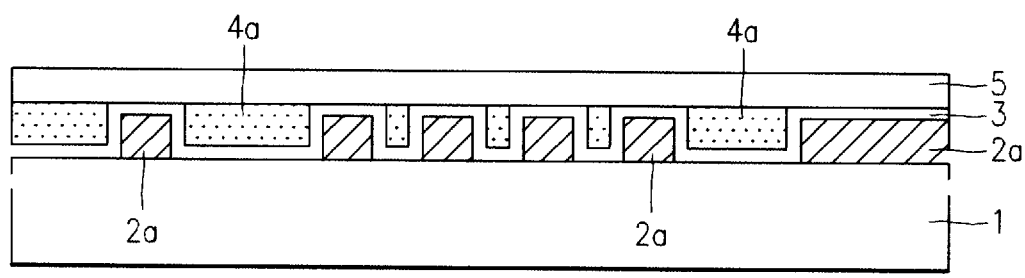
Figure 1F:
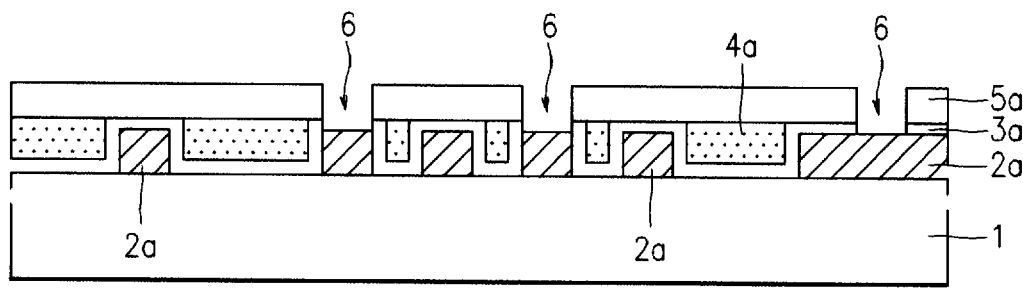
Figure 1G:
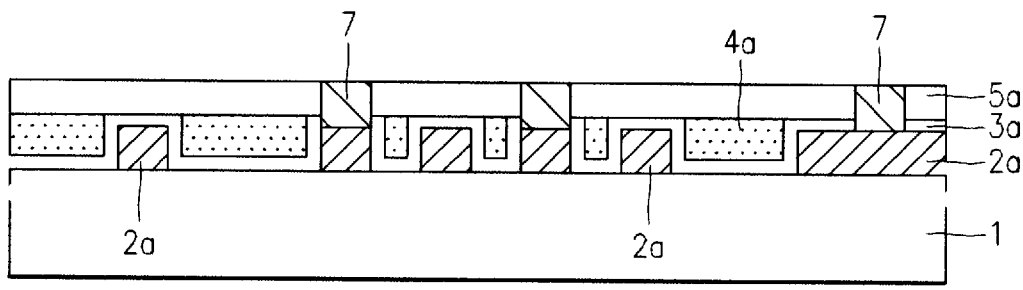
Figure 2A:
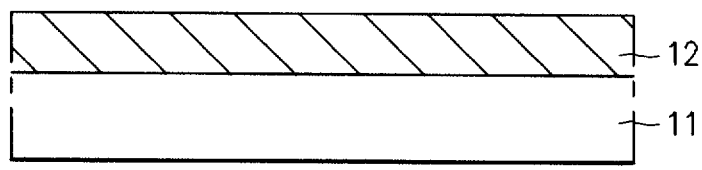
FIGS. 2a to 2f illustrate a manufacturing procedure of a metal line according to a first embodiment of the invention.

As illustrated in FIG. 2a, a method according to a first embodiment of the invention is performed in such a manner that first, a semiconductor substrate 11 is prepared, and thereafter a material among polysilicon, silicide and metal is selectively deposited on the semiconductor substrate, to form a conductive layer 12.

Figure 2B:
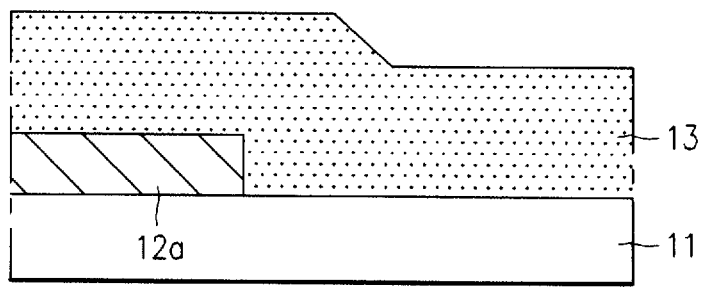

As illustrated in FIG. 2b, the conductive layer 12 is selectively removed by a photolithography and etching process, to form a first line 12a.

A photosensitive layer 13 is coated on an exposed surface of the first line 12a and semiconductor substrate 11. Alternatively, a photosensitive material such as polymer and polyimide other than the photosensitive layer 13 can be used therefor.

Figure 2C:
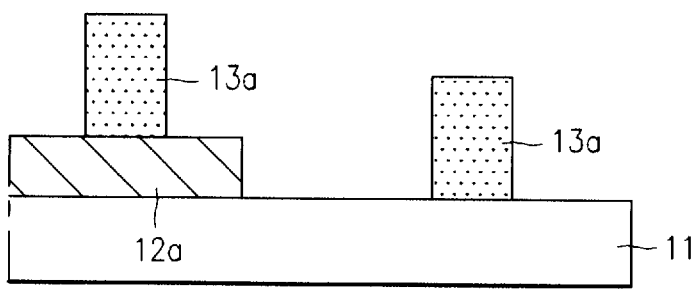

As illustrated in FIG. 2c, portions of the photosensitive layer 13 are selectively removed by exposing and developing processes, to form a plug pattern 13a. The plug pattern 13a is formed thicker than an interlevel insulating layer 14 remaining during a planarization process performed as will be described in the following step.

Figure 2D:
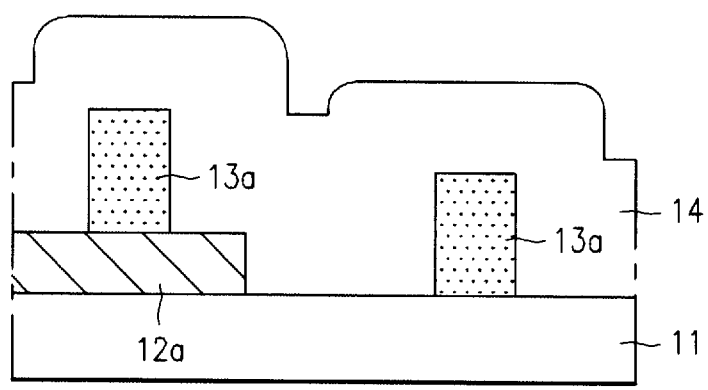

As illustrated in FIG. 2d, an oxide layer is deposited on the exposed surface of the first line 12a including the plug pattern 13a and semiconductor substrate 11, to form an interlevel insulating layer 14. Here, the oxide layer is selectively deposited using either a chemical vapor deposition (CVD) method using electro-cycro resonance (ECR), or plasma enhanced CVD (PECVD). In addition, the deposition of the oxide layer is performed at a temperature below 200° C. where the plug pattern 13a is not transformed, by selectively using either tetraethylorthosilicate (TEOS) or $SiH_4/O_2$.

The interlevel insulating layer 14 is formed by a thickness of over about 5000 Å and thereby fully serves as an insulating layer even after planarization as will be described in the following step.

Figure 2E:
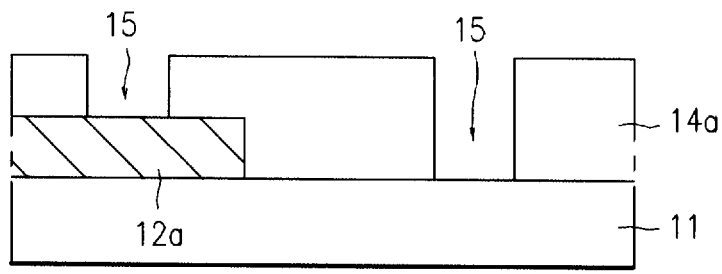

As illustrated in FIG. 2e, the interlevel insulating layer 14a is selectively removed and its surface is then planarized to maintain a predetermined thickness by chemical mechanical polishing (CMP). Here, the CMP process is performed using a polishing material including a colloidal silica, and slurry including KOH of 7 to 12 PH.

The plug pattern 13a is fully removed during the polishing step of the interlevel insulating layer 14. The plug pattern 13a is removed by either one of the two following methods.

First, a solution material by which the plug pattern is dissolved, such as $O_3H_2SO_4$ and HF, is added to the slurry in the polishing step to planarize the interlevel insulating layer 14 and fully remove the plug pattern 13a.

Second, a solution material by which the plug pattern 13a is dissolved, such as $O_3H_2SO_4$ in the case of a photosensitive layer, or HF in the case of spin on glass (SOG), is added together with a cleaning solution to perform cleaning just after the polishing step and to simultaneously remove the plug pattern 13a. In such a manner, the plug pattern 13a is removed and a contact hole 15 is formed on the portion of the interlevel insulating layer 14a where the plug pattern 13a is removed.

In addition, the plug pattern 13a can serve as a polish stop layer without forming an additional polish stop layer in the polishing step.

Figure 2F:
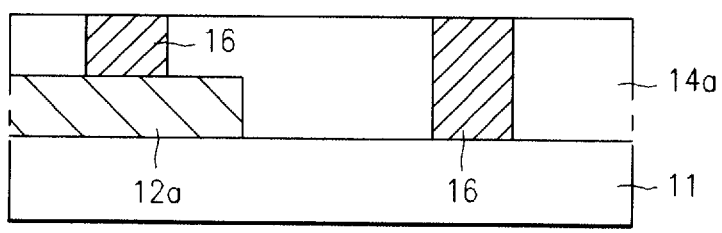

As illustrated in FIG. 2f, a material among Al, Cu, Ti, and TiN is selectively deposited on the exposed surface of the interlevel layer 14a including the contact hole 15, to form a conductive layer 16.

The second conductive layer 16 is selectively removed by a photolithography and etching step or etch-back process, to form a second line 16 and thereby complete the formation process of the metal line.

FIGS. 3a to 3f illustrate a manufacturing procedure of a metal line according to a second embodiment of the invention.

Figure 3A:
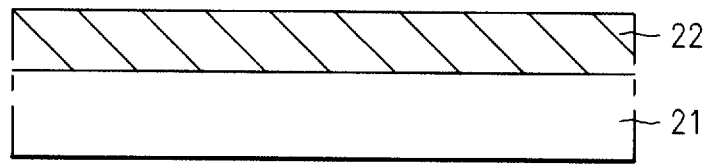
FIGS. 3a to 3f illustrate a manufacturing procedure of a metal line according to a second embodiment of the invention.

As illustrated in FIG. 3a, a method according to a second embodiment of the invention is performed in such a manner that first, a semiconductor substrate 21 is prepared, and thereafter a material among polysilicon, silicide and metal is selectively deposited on the semiconductor substrate 21 to form a conductive layer 22.

Figure 3B:
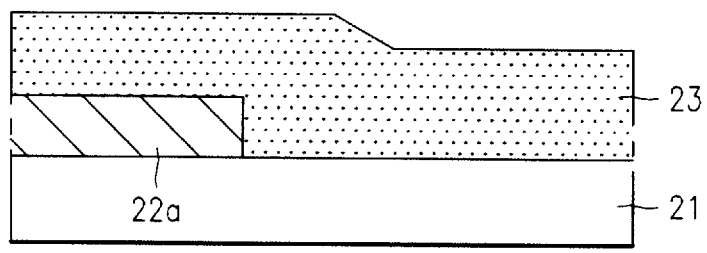

As illustrated in FIG. 3b, portions of the conductive layer 22 are selectively removed by a photolithography and etching process to form a first line 22a.

A photosensitive layer 23 is coated on an exposed surface of the first line 22a and semiconductor substrate 21. Alternatively, a photosensitive material such as polymer and polyimide other than the photosensitive layer 23 can be used as a replacement therefor.

Figure 3C:
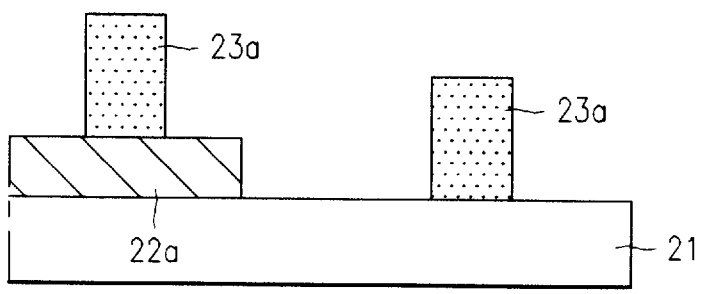

As illustrated in FIG. 3c, the photosensitive layer 23a is selectively removed by exposing and developing processes, to form a plug pattern 23a. The plug pattern 23a is formed thicker than an interlevel insulating layer remaining during planarization performed as will be described in the following step.

Figure 3D:
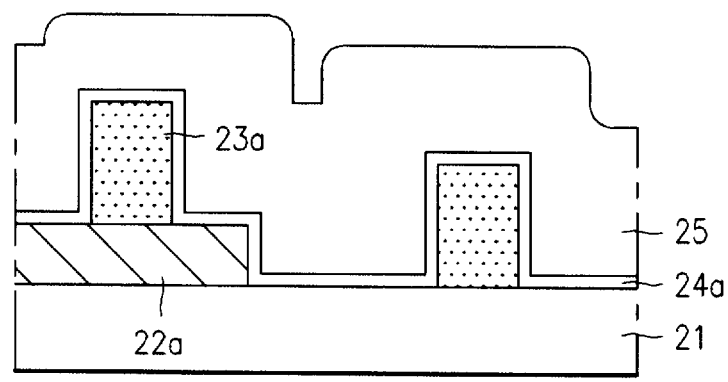

As illustrated in FIG. 3d, an oxide layer is deposited on the exposed surface of the first line 22a including plug pattern 23a and semiconductor substrate 21, to form an interlevel insulating layer 24. Here, the oxide layer is selectively deposited using either a CVD method using ECR, or PECVD. In addition, the deposition of the oxide layer is performed at a temperature below 200° C. where the plug pattern 23a is not transformed, by selectively using either TEOS or $SiH_4/O_2$, and thereafter the oxide layer is formed to a thickness in the range of 500–2000 Å.

An oxide layer is deposited on the first interlevel insulating layer 24 using the same method as the first embodiment, to form a second interlevel insulating layer 25. Here, the deposition of the oxide layer is performed at a temperature below 400° C., using TEOS, flurotetraethylorthosilicate (FTES), $SiH_4/O_2$. The interlevel insulating layer 25 is formed at a thickness of over about 4000 Å, to thereby fully serve as an insulating layer even after planarization as will be described in the following step.

Figure 3E:
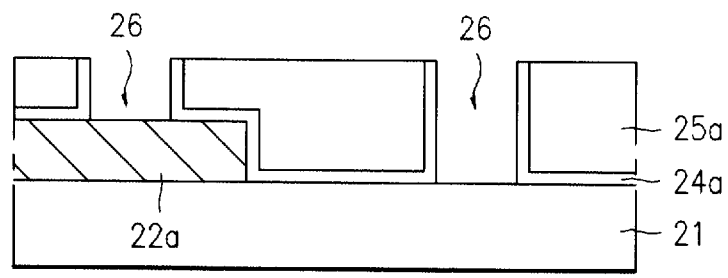

As illustrated in FIG. 3e, the first and second interlevel insulating layers 24 and 25a are selectively removed and their surfaces are then planarized to maintain a predetermined thickness by CMP and to expose the surface of the plug pattern 23a. Here, the CMP process is performed by a polishing material including colloidal silica and slurry including KOH of 7 to 12 PH.

The plug pattern 23a is fully removed during the polishing step of the first and second interlevel insulating layers 24 and 25. The plug pattern 23a is removed using either of the two following methods.

First, a solution material by which the plug pattern is dissolved, such as photosensitive layer ($O_3H_2SO_4$), is added to the slurry in the polishing step, to planarize the first and second interlevel insulating layers 24 and 25, and to fully remove the plug pattern 23a.

Second, a solution material by which the plug pattern 23a is dissolved, is added together with a cleaning liquid, to perform cleaning just after the polishing step and to simultaneously remove the plug pattern 23a.

In this manner, the plug pattern 23a is removed and a contact hole 26 is formed on the portion of the interlevel insulating layer 24a where the plug pattern 23a has been removed.

In addition, the plug pattern 23a can serve as a polish stop layer without forming an additional polish stop layer in the polishing step.

Figure 3F:
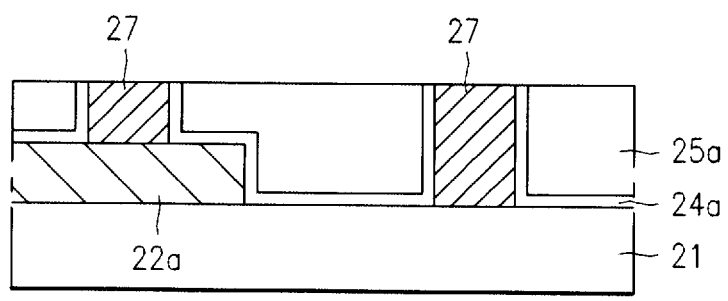

As illustrated in FIG. 3f, a material among Al, Cu, Ti and TiN is selectively deposited on the exposed surface of the first and second interlevel layers 24 and 25a including the contact hole 26, to form a conductive layer 27.

Portions of the second conductive layer 27 are selectively removed by a photolithography and etching step or etch-back process, to form a second line 27 and thereby complete the formation process of the metal line.

FIGS. 4a to 4g illustrate a manufacturing procedure of a metal line according to a third embodiment of the invention.

Figure 4A:
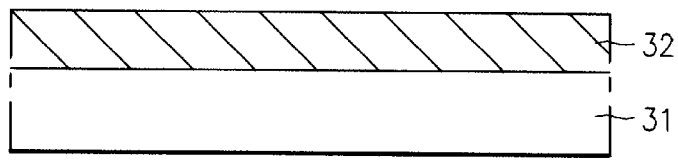
FIGS. 4a to 4g illustrate a manufacturing procedure of a metal line according to a third embodiment of the invention.

As illustrated in FIG. 4a, the method according to a third embodiment of the invention is performed in such a manner that first, a semiconductor substrate 31 is prepared, and thereafter a material among polysilicon, silicide and metal is selectively deposited on the semiconductor substrate 31, to form a conductive layer 32.

Figure 4B:
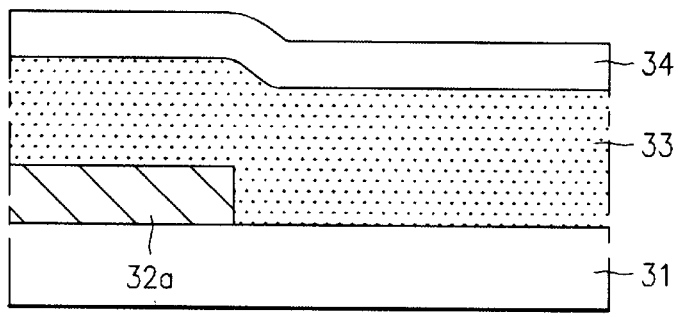

As illustrated in FIG. 4b, the conductive layer 32 is selectively removed by a photolithography and etching process to form a first line 32a.

An SOG layer (e.g., layer of spin on glass) 33 is formed on the exposed surface of the first line 32a and semiconductor substrate 31 and then a photosensitive layer 34 is coated on the SOG layer 33. Here, a photosensitive material such as polymer and polyimide other than the photosensitive layer 34 can be used as a replacement therefor.

Figure 4C:
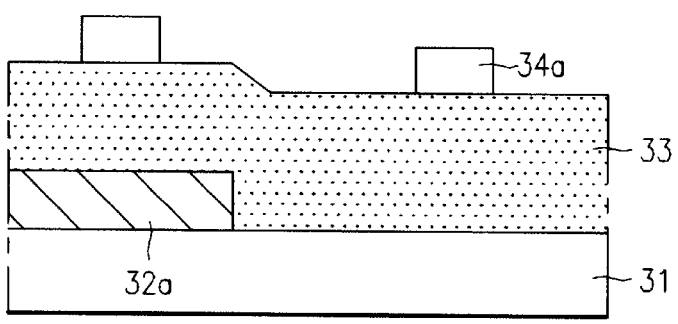

As illustrated in FIG. 4c, portions of the photosensitive layer 34 are selectively removed by the exposing and developing processes to define a plug pattern on the SOG layer 33.

Figure 4D:
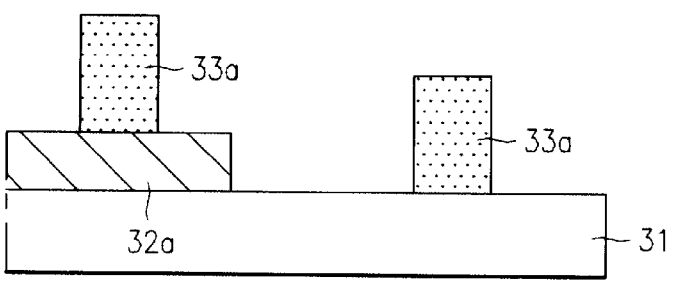

As illustrated in FIG. 4d, the SOG layer 33 is selectively removed by a photolithography and etching step using the portion of the photosensitive layer 34a remaining from the above step as a mask, to form a second line connecting plug pattern 33a.

The reduction of the SOG layer 33 is performed by reactive ion etch (RIE) using gas such as $CF_4$, $CHF_3$ or $O_2$.

The plug pattern 33a is formed thicker than an interlevel insulating layer 35 remaining during a planarization procedure performed in the following step.

Figure 4E:
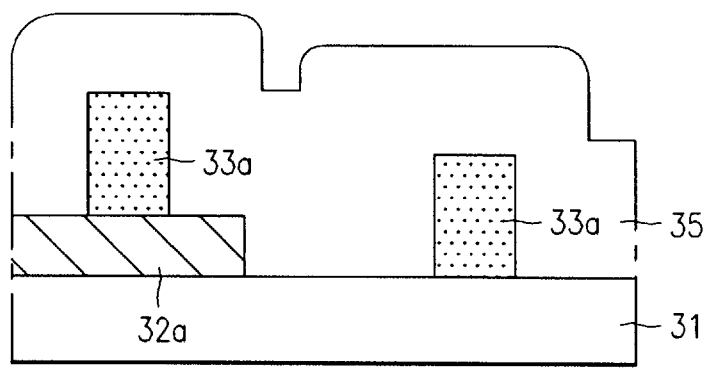

As illustrated in FIG. 4e, an oxide layer is deposited on the exposed surface of the first line 32a including the plug pattern 33a and the semiconductor substrate 31 to form an interlevel insulating layer 35, using either a method of CVD by ECR or PECVD as with the interlevel insulating layer 25 of the first embodiment. Here, the deposition of the oxide layer is performed at a temperature below 200° C. where the plug pattern, SOG layer 33a, is not transformed, using TEOS, FTES, $SiH_4/O_2$.

The interlevel insulating layer 35 is formed to have a thickness of over about 5000 Å, to thereby fully serve as an insulating layer after planarization as will be described in the following step.

Figure 4F:
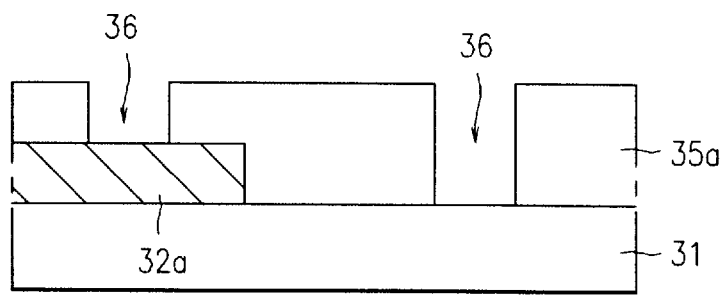

As illustrated in FIG. 4f, portions of the interlevel insulating layer 35a are selectively removed and the surface of the layer is then planarized to a predetermined thickness by CMP.

Here, the CMP process is performed using a polishing material including colloidal silica and slurry including KOH of 7 to 12 PH.

The plug pattern 33a is fully removed during the polishing step of the interlevel insulating layer 35.

The plug pattern 33a is removed by the same method as in the first embodiment, namely, by either one of the two following methods.

In the first method, a solution material by which the plug pattern is dissolved, such as HF in the case of SOG, is added to the slurry in a polishing step, to planarize the interlevel insulating layer 35 and fully remove the plug pattern 33a.

In the second method, a solution material by which the plug pattern 33a is dissolved, such as $O_3H_2SO_4$ in the case of a photosensitive layer, or HF in the case of SOG, is added together with a cleaning liquid to perform cleaning just after the polishing step and to simultaneously remove the plug pattern 33a. In this manner, the plug pattern 33a is removed and a contact hole 36 is formed on the portion of the interlevel insulating layer 35a where the plug pattern 33a has been removed.

In addition, the plug pattern 33a can serve as a polish stop layer without forming an additional polish stop layer in the polishing step.

Figure 4G:
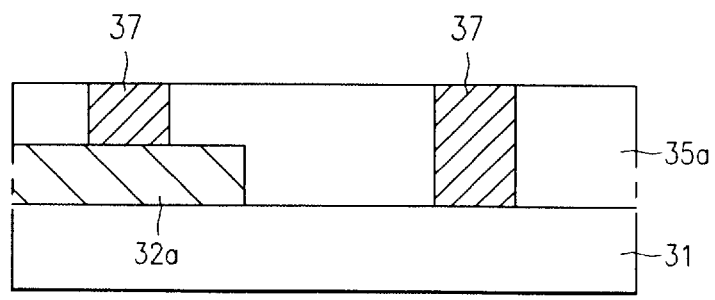

As illustrated in FIG. 4g, a material among Al, Cu, Ti and TiN is selectively deposited on the exposed surface of the interlevel layer 35a including the contact hole 36 to form a second conductive layer 37.

The second conductive layer 37 is selectively removed by a photolithography and etching step or etch-back process to form a second line 37 and thereby complete the forming process of the metal line.

The method of the invention has at least the following effects.

First, the upper and lower lines connecting the contact hole are simultaneously formed in the planarization step, thereby simplifying the process and enhancing productivity.

Second, a second line is formed without removing the second line conductive layer, thereby facilitating the formation process.

Third, a contact hole is formed by removing the plug pattern using wet etching in the polishing step (e.g., simultaneously with planarizing) without selectively removing the interlevel insulating layer by a dry-etching in forming the upper and lower line contact hole, thereby preventing damage caused due to a plasma occurring in the dry-etching step.

Fourth, the plug pattern can be used as a polish stop layer, and therefore there is no need to form an additional polish stop layer.

It will be apparent to those skilled in the art that various modifications and variations can be made in the method for forming metal line of the present invention without departing from the spirit or scope of the invention. Thus, it is intended that the present invention cover the modifications and variations of this invention provided they come within the scope of the appended claims and their equivalents.

What is claimed is:

1. A method of forming a metal line structure for use with a semiconductor device, the method comprising the steps of:

forming a first line on a semiconductor substrate;

forming a plug pattern on the first line;

forming at least one insulating layer on an exposed surface of the first line and on the plug pattern;

planarizing the insulating layer using a polishing material and, simultaneously, removing the plug pattern to form a contact hole to expose at least a portion of the first line, wherein the polishing material used for planarizing comprises a solution for removing the plug pattern; and forming a second line in the contact hole such that the second line is configured to couple with the first line.

2. The method as claimed in claim 1, wherein the first line is formed using one of polysilicon, silicide, and metal.

3. The method as claimed in claim 1, wherein the plug pattern is formed using one of a photosensitive layer, polymer, and polyimide.

4. The method as claimed in claim 1, wherein the insulating layer is formed using an oxide layer.

5. The method as claimed in claim 4, wherein the oxide layer is formed using one of a chemical vapor deposition (CVD) method using electro-cycro resonance (ECR) and a plasma enhanced chemical vapor deposition (PECVD) method.

6. The method as claimed in claim 4, wherein the oxide layer is formed using one of tetraethylorthosilicate (TEOS), flurotetraethylorthosilicate (FTES), and $SiH_4/O_2$ at a temperature below about 200° C. where the plug pattern is not transformed.

7. The method as claimed in claim 1, wherein the insulating layer is formed to have a thickness of over about 5000 Å.

8. The method as claimed in claim 1, wherein the insulating layer is planarized using a chemical mechanical polishing (CMP) method.

9. The method as claimed in claim 8, wherein the insulating layer is polished using a polishing material including colloidal silica and slurry including KOH of about 7 to 12 PH.

10. The method as claimed in claim 1, wherein the second line is formed using one of Al, Cu, Ti and TiN.

11. The method as claimed in claim 1, wherein the plug pattern is used as a polish stop layer.

12. A method of forming a metal line structure for use with a semiconductor device, the method comprising the steps of:

forming a first line on a semiconductor substrate;

forming a plug pattern on the first line;

forming a first insulating layer on an exposed surface of the first line and on the plug pattern;

forming a second insulating layer on the first insulating layer;

planarizing at least the second insulating layer using a polishing material and, simultaneously, removing the plug pattern to form a contact hole exposing the first line, wherein the polishing material used for planarizing comprises a solution for removing the plug pattern; and forming a second line in the contact hole such that the second line is configured to couple with the first line.

13. The method as claimed in claim 12, wherein the first line is formed of one of polysilicon, silicide, and metal.

14. The method as claimed in claim 12, wherein the plug pattern is formed using one of a photosensitive layer, polymer and polyimide.

15. The method as claimed in claim 12, wherein the first and second insulating layers are formed using an oxide layer.

16. The method as claimed in claim 15, wherein the oxide layer is formed using one of a chemical vapor deposition (CVD) method using electro-cycro resonance (ECR) and a plasma enhanced chemical vapor deposition (PECVD) method.

17. The method as claimed in claim 15, wherein the oxide layer for the first insulating layer is formed using one of tetraethylorthosilicate (TEOS), flurotetraethylorthosilicate FTES, and $SiH_4/O_2$ at a temperature below about 200° C. where the plug pattern is not transformed.

18. The method as claimed in claim 15, wherein the oxide layer for the second insulating layer is formed using one of tetraethylorthosilicate (TEOS), flurotetraethylorthosilicate (FTES), and $SiH_4/O_2$ at a temperature below about 400° C.

19. The method as claimed in claim 12, wherein the thickness of the first insulating layer is formed to be within the range of 500 to 2000 Å.

20. The method as claimed in claim 12, wherein the second insulating layer is formed to have a thickness of over 4000 Å.

21. The method as claimed in claim 12, wherein the second insulating layer is planarized using a chemical mechanical polishing (CMP) method.

22. The method as claimed in claim 21, wherein at least one of the insulating layers is polished with a polishing material including colloidal silica and slurry including KOH of about 7 to 12 PH.

23. The method as claimed in claim 12, wherein the second line is formed using one of Al, Cu, Ti, and TiN.

24. A method of forming a metal line structure for use with a semiconductor device, the method comprising the steps of:

forming a first line on a semiconductor substrate;

forming a plug pattern on the first line;

forming an insulating layer on an exposed surface of the first line and on the plug pattern;

polishing the insulating layer using a polishing material to achieve planarization and, simultaneously, removing the plug pattern to form a contact hole exposing at least a portion of the first line, wherein the polishing material used for planarization comprises a solution for removing the plug pattern; and forming a second line in the contact hole such that the second line is configured to be connected to the first line.

25. The method as claimed in claim 24, wherein the first line is formed of one of polysilicon, silicide and metal.

26. The method as claimed in claim 24, wherein the plug pattern is formed using one of a photo sensitive layer, polymer, polyimide, and spin on glass (SOG).

27. The method as claimed in claim 26, wherein the plug pattern is formed by depositing and patterning a plug patterning layer.

28. The method as claimed in claim 26, wherein the spin on glass (SOG) layer is formed using a spin-on method.

29. The method as claimed in claim 24, wherein the insulating layer is formed using an oxide layer.

30. The method as claimed in claim 29, wherein the oxide layer is formed using one of a chemical vapor deposition (CVD) process using electro-cycro resonance (ECR) and a plasma enhanced chemical vapor deposition (PECVD) process.

31. The method as claimed in claim 29, wherein the oxide layer is formed using a material among tetraethylorthosilicate (TEOS), flurotetraethylorthosilicate (FTES), and $SiH_4/O_2$ at a temperature below about 200° C. where the plug pattern is not transformed.

32. The method as claimed in claim 24, wherein the insulating layer is formed to have a thickness of over about 5000 Å.

33. The method as claimed in claim 24, wherein the insulating layer is planarized using a chemical mechanical polishing (CMP) method.

34. The method as claimed in claim 33, wherein the insulating layer is polished with a polishing material including colloidal silica, and slurry including KOH of about 7 to 12 PH.

35. The method as claimed in claim 24, wherein the second line is formed of one of Al, Cu, Ti, and TiN.

36. The method as claimed in claim 24, wherein the plug pattern is used as a polish stop layer.

* * * * *